United States Patent [19]

Donig; Günther

[11] Patent Number: 5,461,304
[45] Date of Patent: Oct. 24, 1995

[54] SWITCHABLE CURRENT SOURCE CIRCUIT AND PHASE DETECTOR CONFIGURATION HAVING SUCH A CIRCUIT

[75] Inventor: Günther Donig, Ottobrunn, Germany

[73] Assignee: Siemens Aktiengesellschaft, Munich, Germany

[21] Appl. No.: 64,845

[22] Filed: May 20, 1993

[30] Foreign Application Priority Data

May 20, 1992 [DE] Germany ............... 42 16 712.4

[51] Int. Cl.$^6$ ..................................................... G05F 3/16
[52] U.S. Cl. ........................................................ 323/315
[58] Field of Search ................................... 323/312, 315, 323/316, 317; 307/296.1, 296.6, 296.7, 296.8; 330/288, 310, 311; 327/530, 535, 537, 538, 543, 544

[56] References Cited

U.S. PATENT DOCUMENTS

| | | | |
|---|---|---|---|
| 4,866,368 | 9/1989 | Bird | 323/317 |
| 4,950,976 | 8/1990 | Wagoner | 323/315 |
| 5,021,692 | 6/1991 | Hughes | 323/316 |
| 5,250,914 | 10/1993 | Kondo | 331/111 |
| 5,311,146 | 5/1994 | Brannon et al. | 330/288 |
| 5,329,247 | 7/1994 | Bayer | 330/288 |

OTHER PUBLICATIONS

"Electronic Circuits Design and Application" Tietze et al, pp. 57–59, pp. 86 & 87, 1991, Germany.
"ICS for Radio Equipment" Data Book, Siemens, pp. 51–72, 1989, Germany.

*Primary Examiner*—Matthew V. Nguyen
*Attorney, Agent, or Firm*—Herbert L. Lerner; Laurence A. Greenberg

[57] ABSTRACT

A switchable current source circuit includes a current mirror configuration having a control stage and an output stage. The control stage has a voltage output and a current input and furnishes a control voltage at the voltage output as a function of a control current impressed at the current input. The output stage has a control input connected to the voltage output of the control stage and a control path with two terminals. One of the terminals forms a current output of the current source circuit. An electronic switch has one terminal connected to the other of the terminals of the control path of the output stage, another terminal being connected to a supply potential terminal, and a control input. The current source circuit is switched on and off as a function of triggering the control input of the electronic switch. A capacitor connects the control input of the electronic switch to the control input of the output stage of the current mirror configuration. A bipolar current source configuration includes at least two of the switchable current source circuits. A phase detector has an output stage including at least one of the bipolar current source configurations.

14 Claims, 2 Drawing Sheets

SWITCHABLE CURRENT SOURCE CIRCUIT AND PHASE DETECTOR CONFIGURATION HAVING SUCH A CIRCUIT

BACKGROUND OF THE INVENTION

FIELD OF THE INVENTION

The invention relates to a switchable current source circuit including an electronic switch; and a current mirror configuration having a control stage furnishing a control voltage at a voltage output as a function of a control current impressed at a current input, and an output stage having a control input connected to the voltage output of the control stage and a control path with two terminals, one of which forms a current output of the current source circuit and the other of which is connected to one terminal of the electronic switch, the other terminal of the electronic switch being connected to a supply potential terminal, and the current source circuit being switchable on and off as a function of the triggering of the control input of the electronic switch. The invention also relates to a phase detector configuration having such a circuit.

In particular, the Siemens data book entitled "ICs for Radio Equipment 1989/90", pp.51–72, describes the TBB 206 integrated circuit, which is commercially available, and its use in a PLL. The phase detector used in that circuit has an output stage including two current source circuits, which furnish currents with different signs to a common circuit node forming the output. The analog-controlled current sources used in that case do not reach their desired output current until a relatively long time after being triggered, which is approximately 30 ns. Such a long rise time of the output currents of those current sources also makes the width of the anti-backlash pulses that are required in such applications relatively great. Due to those anti-backlash pulses, the output spectrum of the phase detector includes not only the desired output frequency but also a large number of secondary lines, each being spaced apart from an input reference frequency of the phase detector. If those anti-backlash pulses are relatively wide, then the power content of the secondary lines is relatively high, so that an application in a phase-locked loop requires the use of an expensive filter, in order to adhere to a specified ratio between the signal level and the noise level.

Current mirror circuits per se are described, among other sources, in the book entitled "Halbleiterschaltungstechnik" [Semiconductor Circuitry] by Tietze and Schenk, 9th Edition, 1991, in both chapter 4.6.3, pp. 62–64, particularly FIG. 4.36, and chapter 5.5, pp. 94–97, particularly FIG. 5.13. Such current mirror circuits have a control stage on which a control current is impressed and which furnishes a control voltage as a function of the impressed control current. Moreover, such current mirror circuits have an output stage, which furnishes an output current as a function of the control voltage of the control stage. The term "current mirror circuit" is used herein to mean that the output current is proportional to the input current. Especially in integrated circuits, a current transfer is brought about with the aid of a transistor area ratio, in which the effective area of a transistor forming the output stage is greater by a certain factor than the effective area of a transistor forming the control stage.

It is also known that the output stage, which is typically hard-wired to a reference potential, is switchable to that reference potential through an electronic switch. If that electronic switch is made conducting, the constant current then flows at the current output of that current source, while if that electronic switch is blocked, no current flows at the current output of the current source. When such switchable current sources are turned on, the control voltage furnished by the control stage drops somewhat at the turn-on time, so the desired constant current at the current source circuit output does not flow immediately.

SUMMARY OF THE INVENTION

It is accordingly an object of the invention to provide a switchable current source circuit and a phase detector configuration having such a circuit, which overcome the hereinafore-mentioned disadvantages of the heretofore-known devices of this general type and which do so in such a way that when the circuit is used in the output stage of a phase detector, the above problems arise to a considerably lesser extent, and in which the turn-on performance is improved.

With the foregoing and other objects in view there is provided, in accordance with the invention, a switchable current source circuit, comprising a current mirror configuration having a control stage and an output stage; the control stage having a voltage output and a current input, and the control stage furnishing a control voltage at the voltage output as a function of a control current impressed at the current input; the output stage having a control input connected to the voltage output of the control stage, and the output stage having a control path with two terminals, one of the terminals forming a current output of the current source circuit; an electronic switch having one terminal connected to the other of the terminals of the control path of the output stage, the electronic switch having another terminal being connected to a supply potential terminal, and the electronic switch having a control input, the current source circuit being switched on and off as a function of triggering the control input of the electronic switch; and a capacitor connecting the control input of the electronic switch to the control input of the output stage of the current mirror configuration.

In accordance with another feature of the invention, the transistors and switches include self-locking n-channel MOS transistors, or self-locking p-channel MOS transistors, or npn bipolar transistors, or pnp bipolar transistors.

In accordance with a further feature of the invention, the control stage includes an n or p-channel self-locking MOS transistor having drain and gate terminals being connected together to form the current input and the voltage output of the control stage, the transistor having a source terminal being connected to a supply potential terminal.

In accordance with an added feature of the invention, there is provided a further transistor having a drain-to-source path connected between the source terminal of the transistor of the control stage and the supply potential, the further transistor having a gate terminal being acted upon by a potential of opposite polarity, such as another supply potential.

In accordance with an additional feature of the invention, the electronic switch includes an n or p-channel self-locking MOS transistor having a drain terminal, and the output stage includes a self-locking MOS transistor having a drain terminal forming the current output of the current source circuit, a gate terminal forming the control input of the output stage and a source terminal connected to the drain terminal of the transistor of the electronic switch.

In accordance with yet another feature of the invention, the capacitor includes a field effect transistor having a gate terminal forming one connection terminal of the capacitor and other terminals together forming another connection terminal of the capacitor.

In accordance with yet a further feature of the invention, the electronic switch includes a transistor having a control input connected to the gate terminal of the transistor of the capacitor.

With the objects of the invention in view, there is also provided a bipolar current source configuration, comprising at least two of the switchable current source circuits, the current outputs carrying output currents with different signs and together forming a current output of the bipolar current source configuration.

With the objects of the invention in view, there is additionally provided, in a phase detector, an output stage, comprising at least two of the bipolar current source configurations, each of the bipolar current source configurations including at least two of the switchable current source circuits.

In accordance with another feature of the invention, the output terminals of the current source circuits of the bipolar current source configurations together form a signal output of the phase detector.

In accordance with a concomitant feature of the invention, the current source circuits furnish output currents of different magnitude at the output terminals, and each two of the output terminals furnish output currents with different signs and a current of equal magnitude in terms of quantity.

Other features which are considered as characteristic for the invention are set forth in the appended claims.

Although the invention is illustrated and described herein as embodied in a switchable current source circuit and a phase detector configuration having, such a circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENT

Figure 1:
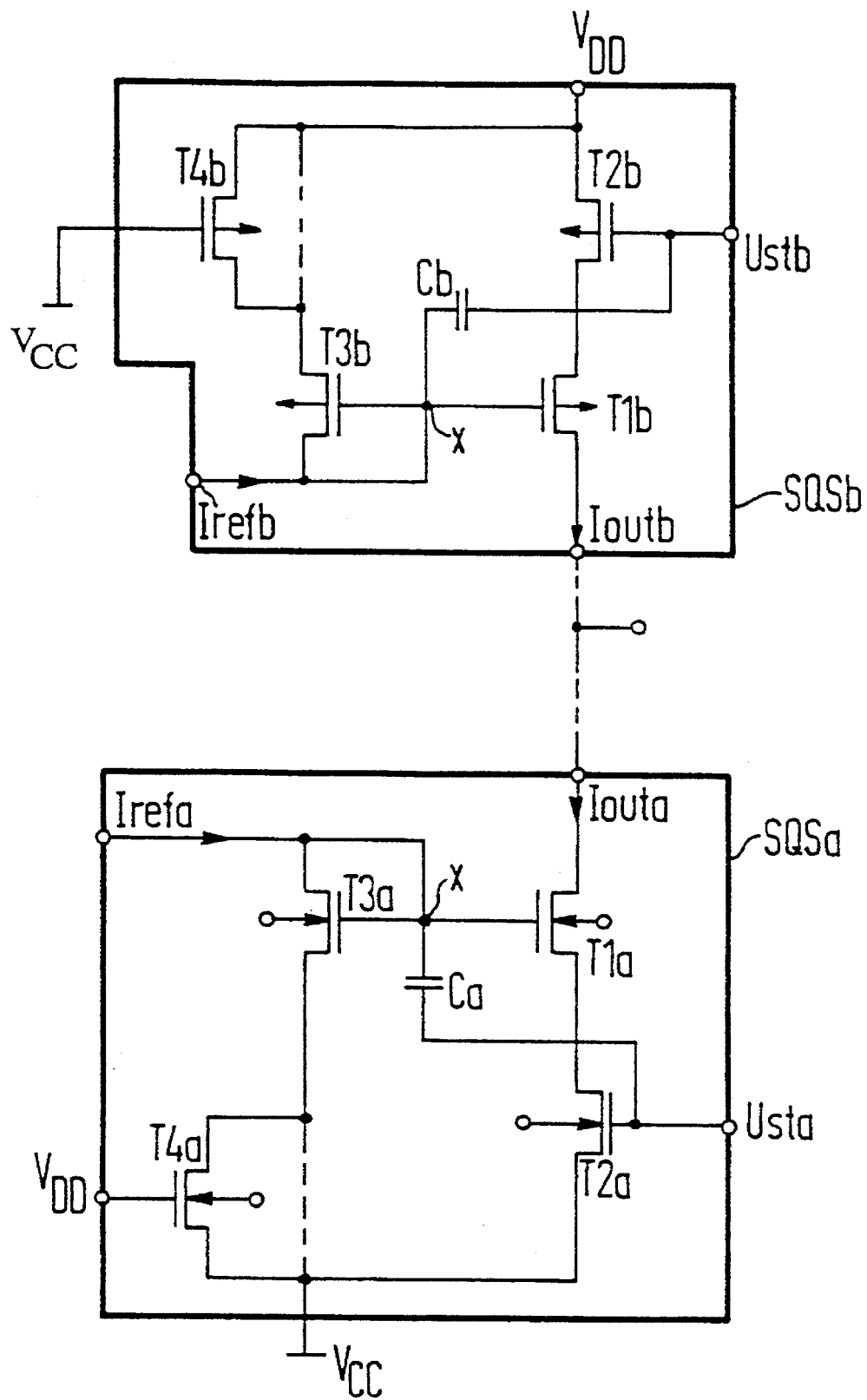
FIG. 1 is a schematic diagram of a switchable current source circuit according to the invention which is made by n-channel MOS circuitry and a current source circuit according to the invention which is made by p-channel MOS circuitry, both of which together form a bipolar current source configuration.

Referring now to the figures of the drawing in detail and first, particularly, to FIG. 1 thereof, there is seen a current source circuit SQSa according to the invention which is made by n-channel MOS circuitry and a current source circuit SQSb according to the invention which is made by p-channel MOS circuitry. Identical circuit elements have the same reference symbols, with a letter a added to the reference symbol for the n-channel circuit and a letter b added to the reference symbol for the p-channel circuit. For the sake of simplicity, only the circuit made by the n-channel technique will be described below. The current source circuit SQSa includes a current mirror circuit having a control stage which is constructed as a transistor T3a and having an output stage which is constructed as a transistor T1a. To that end, a drain terminal and a base terminal of the transistor T3a are interconnected and form a voltage output x which is also a control input x of the output stage that is formed by the gate terminal of the transistor T1a. A source terminal of the transistor T3a is connected to a supply potential terminal $V_{CC}$. A broken line represents the fact that this connection can be made directly for the basic mode of operation of the circuit.

A drain terminal of the transistor T1a forms a current output Iouta of the current source circuit SQSa, and a source terminal of the transistor T1a is connected to a drain terminal of a transistor T2a. The transistor T2a is provided as an electronic switch and serves to turn the current source circuit SQSa on and off. To that end, a source terminal of the transistor T2a is connected to the supply potential terminal $V_{CC}$, and a gate terminal thereof is connected to the control voltage terminal Usta as a control input. In order to assure proportionality in the current amplification ratio, the source terminal of the transistor T3a may be connected with a drain terminal of a transistor T4a, rather that being connected directly to the supply potential. In that case, a source terminal of the transistor T4a is connected to the supply potential terminal $V_{CC}$, and in the simplest case a gate terminal thereof is acted upon by a supply potential $V_{DD}$ of the opposite polarity. The transistor T4a assures that the same conditions as are effected in the output path by the switching transistor T2a will prevail in the control or reference path of the current source circuit. This assures the symmetry of the current mirror circuit.

A current transfer ratio between the transistor T3 and the transistor T1 should be of the same magnitude as that between the transistor T4 and the transistor T2.

In an embodiment of the circuit shown using n-channel transistor circuitry, substrate control can additionally be precluded by connecting the bulk terminal.

According to the invention, a capacitor Ca is provided between the input of the control voltage Usta and the control input x of the output stage.

If the transistor T2a is turned on by a voltage change at the control input Usta, then this voltage change is also carried through the capacitor Ca to the control input x of the output stage T1a. Additional charges are carried to the control input x of the output stage in the process.

Turning on the transistor T2a in the circuit described above has the effect of charging a parasitic capacitance contained in the transistor T1a through the gate terminal of that transistor, before the current output Iouta furnishes the desired output current. The capacitor Ca may be dimensioned as needed as a function of the turn-on voltage applied at the control signal input terminal, in such a way that at the moment it is switched on virtually the entire charge quantity is switched through the capacitor Ca to the control input x of the output stage T1a, as needed for charging the gate-to-source capacitor of the transistor. As a result, at the turn-on time, a voltage invasion or intrusion at the control input of the output stage of the current source circuit is prevented.

The size of the capacitor Ca should be chosen as a function of the current density in the current mirror circuit. In particular, it must be large enough to insure that by means of a rise in the control voltage at the gate terminal of the transistor T2a, the voltage at the gate terminal of the transistor T1a will not drop at the turn-on time. If the capacitor Ca is chosen to be overly large, this causes an excess increase in the output current of the current source at the turn-on time. If the capacitor Ca is too small, a drop in the control voltage of the output stage of the current source configuration is merely reduced but not prevented.

FIG. 1 shows the two switchable current source circuits SQSa and SQSb, which are capable of furnishing currents with different signs at their outputs Iouta and Ioutb. As is represented by broken lines, the two current outputs Iouta and Ioutb are combined into one common current output, and as a result a bipolar current source can be made. This kind of bipolar current source configuration is distinguished by the fact that both a current with a positive sign and a current with a negative sign can be furnished at its output. An essential factor for the output current of this bipolar current source is the difference between the current furnished at the terminal Ioutb and the current furnished at the terminal Iouta. Optionally, only the one current source circuit SQSb or the other current source circuit SQSa may be turned on with the aid of the corresponding control voltage Ustb or Usta, but both voltage sources can also be turned on, in which case a differential current can be established as the output current of the bipolar current source by means of different reference currents at current input terminals Irefb and Irefa.

Figure 2:
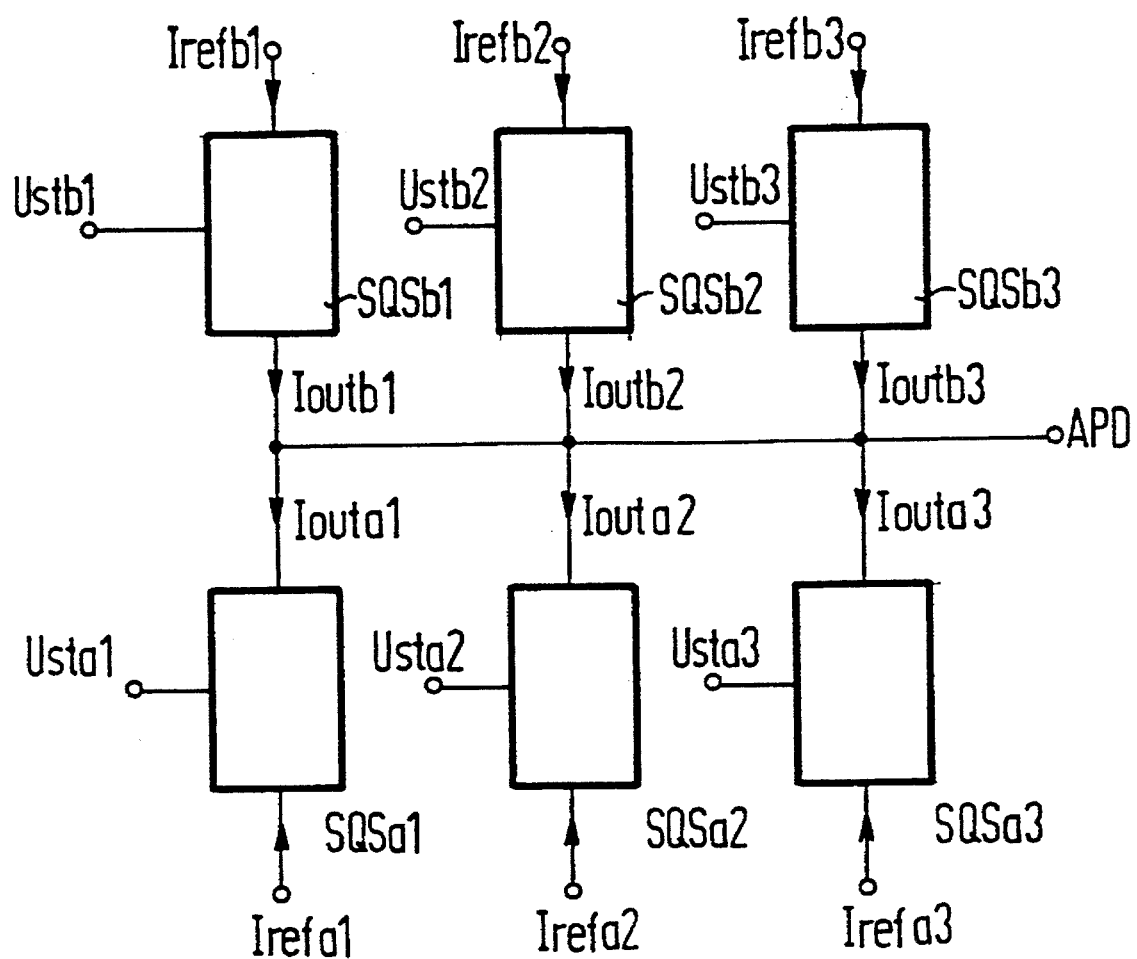
FIG. 2 is a block circuit diagram of an output stage of a phase detector circuit configuration, using switchable current sources according to the invention.

As an exemplary embodiment, FIG. 2 shows a parallel connection of three bipolar current sources of FIG. 1 as an output stage of a phase .detector configuration having an output terminal APD. Advantageously, control voltage terminals Usta1, Usta2 and Usta3 or respective control voltage terminals Ustb1, Ustb2 and Ustb3 are interconnected and are controlled by the phase detector as a function of the phase difference between two input signals. Reference current input terminals Irefa1, Irefa2, Irefa3, Irefb1, Irefb2 and Irefb3 may be triggered with different reference currents, in order to vary the amplitude of the output current at the output terminal APD of the phase detector configuration. Particularly when a phase detector configuration of this kind is used in a phase-locked loop in which channel changes, that is frequency changes, are made, these reference currents can be adapted to the applicable operating frequency.

Figure 3A:
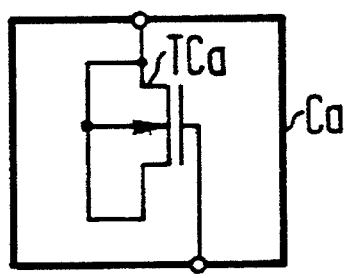
FIG. 3a and 3b schematic circuit diagrams of advantageous embodiments of capacitors made by n-channel and p-channel MOS circuitry, of the kind that can be used in a configuration according to FIG. 1.

FIG. 3a shows one possible construction of the capacitor Ca of FIG. 1 by means of a transistor circuit TCa, in which a gate terminal of a self-locking n-channel FET forms one connection terminal of the capacitor, and a source terminal and a drain terminal, and optionally a bulk terminal, as shown, together form another connection terminal of the capacitor Ca.

Figure 3B:
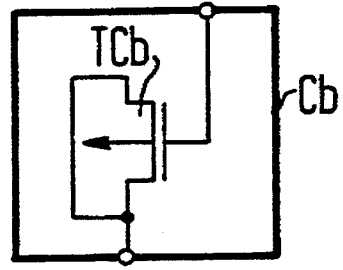

FIG. 3b shows the configuration of FIG. 3a using a p-channel MOS field effect transistor, of the kind that can be used as a capacitor Cb in FIG. 1. This transistor TCb is switched accordingly and because of the circuitry being used, the bulk terminal is not used as the capacitor terminal.

The advantage of the use of a bipolar current source configuration according to the invention in the output stage of a phase detector is that because the rated current is reached quickly by the output stage, the pulse width required for anti-backlash pulses can become very small. This makes the noise power of the secondary lines in the output spectrum of the phase detector, which is dictated by the anti-backlash pulses, considerably less than when current source configurations of the prior art are used. If a phase detector configuration according to the invention is used in a phase-locked loop (PLL), then a desired signal-to-noise ratio can be achieved with a very economical filter.

I claim:

1. A switchable current source circuit, comprising:

a current mirror configuration having a control stage and an output stage;

said control stage having a voltage output and a current input, and said control stage furnishing a control voltage at said voltage output as a function of a control current impressed at said current input;

said output stage having a control input connected to said voltage output of said control stage, and said output stage having a control path with two terminals, one of said terminals forming a current output of the current source circuit;

an electronic switch having one terminal connected to the other of said terminals of said control path of said output stage, said electronic switch having another terminal being connected to a supply potential terminal, and said electronic switch having a control input, the current source circuit being switched on and off as a function of triggering said control input of said electronic switch; and a capacitor connecting said control input of said electronic switch to said control input of said output stage of said current mirror configuration.

2. The current source circuit according to claim 1, wherein said current mirror configuration and said electronic switch include self-locking n-channel MOS transistors.

3. The current source circuit according to claim 1, wherein said current mirror configuration and said electronic switch include self-locking p-channel MOS transistors.

4. The current source circuit according to claim 1, wherein said current mirror configuration and said electronic switch include npn bipolar transistors.

5. The current source circuit according to claim 1, wherein said current mirror configuration and said electronic switch include pnp bipolar transistors.

6. A switchable current source circuit according to claim 1, wherein said control stage includes a self-locking MOS transistor having drain and gate terminals being connected together to form said current input and said voltage output of said control stage, said transistor having a source terminal being connected to the supply potential terminal.

7. The current source circuit according to claim 6, including a further transistor having a drain-to-source path connected between the source terminal of said transistor of said control stage and the supply potential terminal, said further transistor having a gate terminal being acted upon by a potential having a polarity opposite a polarity of the supply potential.

8. The current source circuit according to claim 1, wherein said electronic switch includes a self-locking MOS transistor having a drain terminal, and said output stage includes a self-locking MOS transistor having a drain terminal forming said current output of the current source circuit, a gate terminal forming said control input of said output stage and a source terminal connected to the drain terminal of said transistor of said electronic switch.

9. The current source circuit according to claim 1, wherein said capacitor includes a field effect transistor having a gate terminal forming one connection terminal of said capacitor and other terminals together forming another connection terminal of said capacitor.

10. The current source circuit according to claim 9, wherein said electronic switch includes a transistor having a control input connected to the gate terminal of said transistor of said capacitor.

11. A bipolar current source configuration, comprising at least two switchable current source circuits, each of said current source circuits including:
  a current mirror configuration having a control stage and an output stage;
    said control stage having a voltage output and a current input, and said control stage furnishing a control voltage at said voltage output as a function of a control current impressed at said current input;
    said output stage having a control input connected to said voltage output of said control stage, and said output stage having a control path with two terminals, one of said terminals forming a current output of said current source circuit;
  an electronic switch having one terminal connected to the other of said terminals of said control path of said output stage, said electronic switch having another terminal being connected to a supply potential terminal, and said electronic switch having a control input, said current source circuit being switched on and off as a function of triggering said control input of said electronic switch; and
  a capacitor connecting said control input of said electronic switch to said control input of said output stage of said current mirror configuration;
  said current outputs carrying output currents with different signs and together forming a current output of the bipolar current source configuration.

12. In a phase detector, comprising bipolar current source configurations, each of said bipolar current source configurations including at least two switchable current source circuits, each of said current source circuits including:
  a current mirror configuration having a control stage and an output stage;
    said control stage having a voltage output and a current input, and said control stage furnishing a control voltage at said voltage output as a function of a control current impressed at said current input;
    said output stage having a control input connected to said voltage output of said control stage, and said output stage having a control path with two terminals, one of said terminals forming a current output of said current source circuit;
  an electronic switch having one terminal connected to the other of said terminals of said control path of said output stage, said electronic switch having another terminal being connected to a supply potential terminal, and said electronic switch having a control input, said current source circuit being switched on and off as a function of triggering said control input of said electronic switch; and
  a capacitor connecting said control input of said electronic switch to said control input of said output stage of said current mirror configuration;
  said current outputs of said current source circuits carrying output currents with different signs and together forming current outputs of said bipolar current source configurations.

13. The output stage according to claim 12, wherein said output terminals of said current source circuits of said bipolar current source configurations together form a signal output of the phase detector.

14. The output stage according to claim 13, wherein said current source circuits furnish output currents of different magnitude at said output terminals, and each two of said output terminals furnish output currents with different signs and a current of equal magnitude in terms of quantity.

* * * * *